United States Patent [19]

Gowni

[11] Patent Number: 5,572,715

[45] Date of Patent: Nov. 5, 1996

[54] ARCHITECTURE AND CIRCUITS FOR ELIMINATING SKEWS IN PLDs

[75] Inventor: Shiva P. Gowni, Mississippi State, Miss.

[73] Assignee: Cypress Semiconductor Corporation, San Jose, Calif.

[21] Appl. No.: 151,469

[22] Filed: Nov. 15, 1993

Related U.S. Application Data

[63] Continuation of Ser. No. 657,094, Feb. 15, 1991, abandoned.

[51] Int. Cl.$^6$ ........................................... G06F 13/00
[52] U.S. Cl. .................. 395/555; 395/500; 364/232.8; 364/271.5; 327/262
[58] Field of Search ........................ 395/800, 500, 395/250; 307/465; 371/1; 364/DIG. 1; 327/262

[56] References Cited

U.S. PATENT DOCUMENTS

| | | | |
|---|---|---|---|
| 4,611,133 | 9/1986 | Peterson et al. | 307/465 |
| 4,697,105 | 9/1987 | Moy | 307/465 |
| 4,760,290 | 7/1988 | Martinez | 307/465 |
| 4,949,249 | 8/1990 | Lefsky et al. | 364/DIG. 1 |
| 4,959,646 | 9/1990 | Podkowa et al. | 340/825.83 |
| 4,990,801 | 2/1991 | Caesar et al. | 307/469 |
| 5,083,047 | 1/1992 | Horie et al. | 307/465 |
| 5,101,122 | 3/1992 | Shinonara | 307/465 |
| 5,239,213 | 8/1993 | Norman et al. | 307/465 |
| 5,414,381 | 5/1995 | Nelson et al. | 327/262 |

*Primary Examiner*—Alyssa H. Bowler
*Assistant Examiner*—Walter D. Davis
*Attorney, Agent, or Firm*—Blakely, Sokoloff, Taylor & Zafman

[57] ABSTRACT

A programmable logic device (PLD) architecture that minimizes the skew in the outputs of PLD devices in response to input signal transitions. The architecture emulates the worst case response condition of the memory array portion of the PLD and builds it into a dedicated emulation signal path, which is in parallel with the signal path of the real data between the input and output of the PLD. The output of the emulation signal path then controls the real data output path and thus the output of the PLD. The PLD output equals the real data path output only when the output of the emulation signal path is valid.

13 Claims, 6 Drawing Sheets

ARCHITECTURE AND CIRCUITS FOR ELIMINATING SKEWS IN PLDs

This is a continuation of application Ser. No. 07/657,094, filed Feb. 15, 1991, now abandoned.

BACKGROUND OF THE INVENTION

The present invention relates to semiconductor programmable logic device (PLD) and more particularly to an improved PLD architecture having circuitry that minimizes the dependency of the propagation delay between the input and the output upon the particular bit-pattern stored as product-terms in the memory array.

DESCRIPTION OF THE RELEVANT ART

Programmable logic devices (PLDs) having many architectures are manufactured. For example, U.S. Pat. No. 4,903,223 issued to K. A. Norman, et al. and assigned to Altera Corporation describes one PLD architecture. Another is the version of the CY7C361 from Cypress Semiconductor Corporation of San Jose, Calif., the assignee of this invention, sold prior to incorporating this invention. PLDs are used in digital communication instruments, computers and other data processing applications where fast performance of under fifteen nanoseconds delay from input to output of the PLD is critical.

The general trend in the semiconductor industry has been to decrease the delay through a PLD having a given number of logic gates on a chip. This is typically accomplished by reducing the geometrical dimensions of the MOS or bipolar transistors on the chip, thereby increasing the propagation speed through each transistor, which translates into overall speed improvement of the chip.

It is well known in the art of semiconductor memory design that memory array matrices are prone to array sensing pattern sensitivity. This causes a skew in the propagation delay time through the chip. For example, sensing a "1" logic level from a given memory cell along a bit-line populated with other memory cells also storing a "1" level may result in a longer propagation delay than the delay caused when sensing a "1" level from the same memory cell where that same bit-line has been primarily populated with other memory cells storing a "0" level. Most PLD chips use memory arrays to represent logic gates such as OR, NOR, AND and NAND with a plurality of programmable inputs. Using these memory arrays in PLDs causes skew (a difference) between the delay time in response to an input going from "1" to "0" from the delay time in response to an input going from "0" to "1". This pattern sensitivity of the memory array cannot be overcome merely by reducing the delay time by decreasing the geometrical dimensions of the array transistors.

In prior art PLD devices, this skew due to pattern sensitivity was ignored since it constituted only a small portion the total delay time through the PLD chip. The longest propagation delay was the one specified in the PLD data sheet. For example, a PLD chip of the prior art with eight outputs, each simultaneously sensing a different bit-line in response to a simultaneous transition of all the inputs, may present valid data at the output at intervals as short as ten nanoseconds. However the data sheet will still specify the longest delay time as the manufacturer's guaranteed performance specification.

Most users of PLD chips, such as personal-computer designers, are not aware of the pattern sensitivity of any particular PLD. Yet this skew between the response time of different outputs to simultaneous transition of the inputs may cause a malfunction of many system design prototypes, delaying time-to-market of new products.

It is an object of the present invention to minimize the skew in the outputs of PLD chips in response to input signal transitions by employing new architecture that actually adds circuits to the common PLD architecture, yet only increases the worst case propagation delay time of PLD chips by a small amount.

SUMMARY OF THE INVENTION

The present invention minimizes the skew in the outputs of PLD chips in response to input signal transitions by emulating the worst case response condition of the memory array portion of the PLD and building that worst case into a dedicated emulation signal path which is connected in parallel to the signal path of the real data between the input and output. The output of the emulation signal path then controls the path between the output of the real data path and the output of the PLD chip. The PLD output equals the real data path output only when the output of the emulation signal path is valid.

Briefly stated, the programmable logic device architecture of the invention, for the elimination of output skews due to memory logic array pattern sensitivity, has an input to and an output from the programmable logic device (PLD) which includes a latch, a real signal path having a worst case delay connected between the input and the latch, and an emulation signal path connected between the input and the latch. The emulation signal path generates a delay at least substantially equal to the worst case delay in the real signal path. This architecture permits the output signal from the latch to emerge only when enabled by a signal from the emulation signal path after a time equal to or greater than the worst case delay through the real signal path, thereby preventing timing skews in the output data from the PLD.

BRIEF DESCRIPTION OF THE DRAWINGS

A complete understanding of the present invention and other advantages and features thereof may be gained from a consideration of the following description of a preferred embodiment taken in conjunction with the accompanying drawings in which.

DETAILED DESCRIPTION OF THE INVENTION

Figure 1:
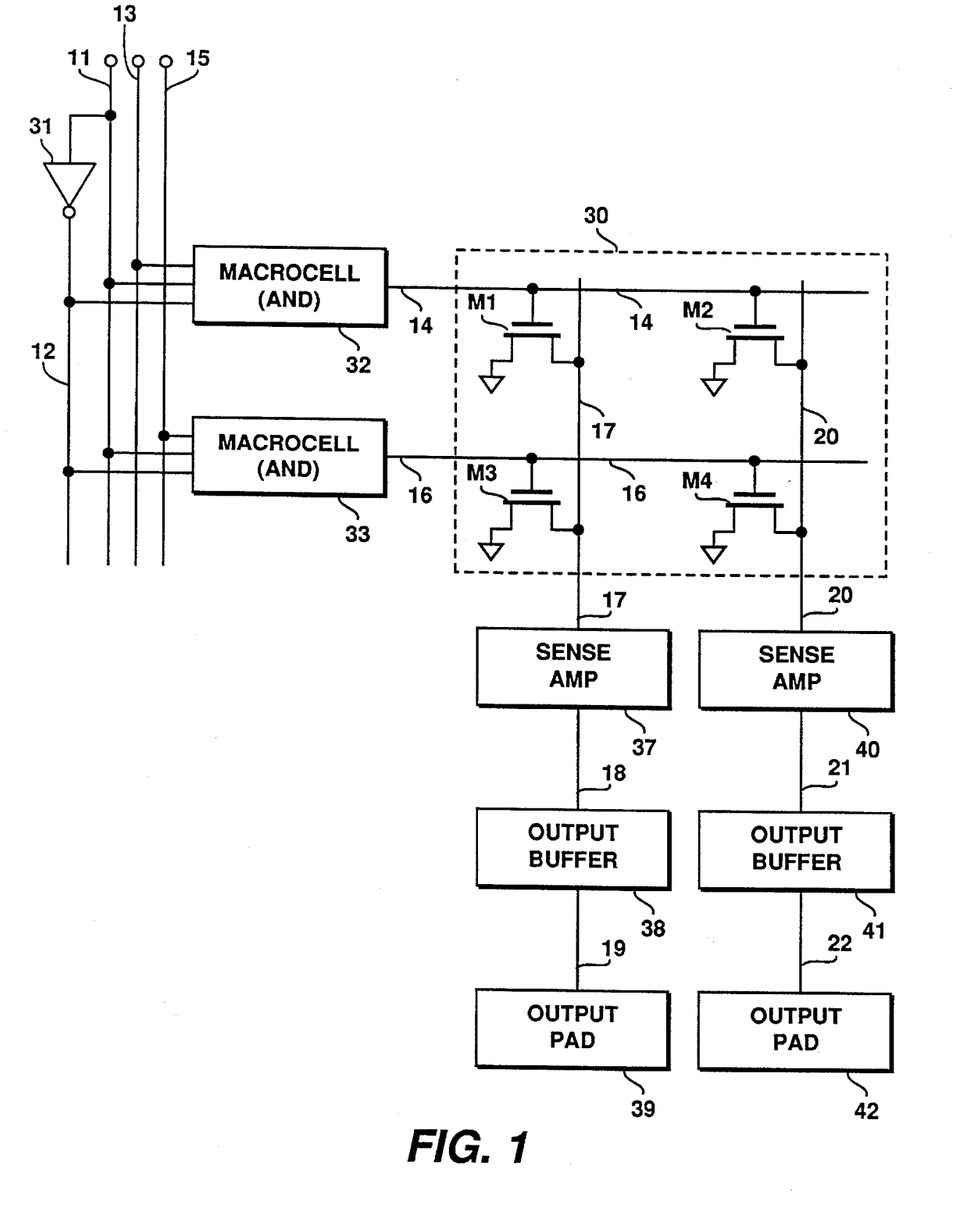
FIG. 1 is a block diagram of a prior art PLD chip.

FIG. 1 depicts the overall functional block diagram of a common architecture for a programmable logic device (PLD) of the prior art. This prior art PLD comprises an input line 11 which feeds into an inverter 31 that generates on line 12 the complementary logic to the input 11. Other input lines 13 and 15 also connect logic signals into the PLD, and their complements (not shown) are also generated in the PLD of FIG. 1. The inputs 11, 13 and 15 and their complements feed into macrocell blocks 32 and 33, each of which typically includes a memory array that performs the equivalent of an AND logical function. The output of the macrocells 32 and 33 feed into memory array 30 through word lines 14 and 16 respectively. The memory array 30 performs the equivalent of the logical function OR, and is thus named "OR-array" 30. The outputs of OR-array 30 are typically sensed through bit lines 17 and 20 by sense amplifiers 37 and 40, respectively, using circuits which are well known in the art. The outputs of sense amps 37 and 40 connect through lines 18 and 21 to output buffers 38 and 41, respectively. Output buffers 38 and 41 translate the internal PLD voltage levels to the voltage levels set up by the electronics industry to represent a logical "0" and a logical "1". Output buffer 38 drives its signal to the output pad 39 through line 19 and output buffer 41 drives its signal to the output pad 42 through line 22.

The output pads 39 and 42 will carry logical signals which depend upon the interaction between the data stored in the AND-array of macrocells 32 and 33, and the data stored in OR-array 30.

Most PLD chips are designed to be user friendly so that a user of the chip may permanently program the contents of the AND and OR-arrays to store proprietary data. To provide users with such flexibility, the memory arrays are fabricated to include UVEPROM, EEPROM, metal fuses, silicon antifuses or other non-volatile memory cells commonly used in the art. The user may then electrically program a PLD chip to derive a bit-pattern that performs a user-selected logic function. For example in the OR-array 30 there are depicted four EPROM memory cells $M_1$, $M_2$, $M_3$ and $M_4$ for the purpose of illustrating the number of patterns that may be stored in this two-by-two memory array. In practice, actual memory arrays are much larger to allow many more design possibilities.

In OR-array 30 transistors $M_1$, $M_2$, $M_3$ and $M_4$ may each store a "0" logic state causing the memory array to exhibit a pattern of all "0"s. On the other hand the transistors $M_1$, $M_2$, $M_3$ and $M_4$ may each store a "1" logic state causing the memory array to exhibit a pattern of all "1"s. Any one of the other fourteen combinations which are generated by four binary bits may also be stored in OR-array 30, each producing a different pattern. From practical experience and measurements conducted on memory arrays, such as OR-array 30, the propagation delay time from the array word line inputs to the array bit line outputs has been shown to be dependent upon the stored patterns. For a given memory cell technology, such as an EPROM, there may be one or more worst-case patterns which produce the longest propagation delay time through the array.

Figure 2:
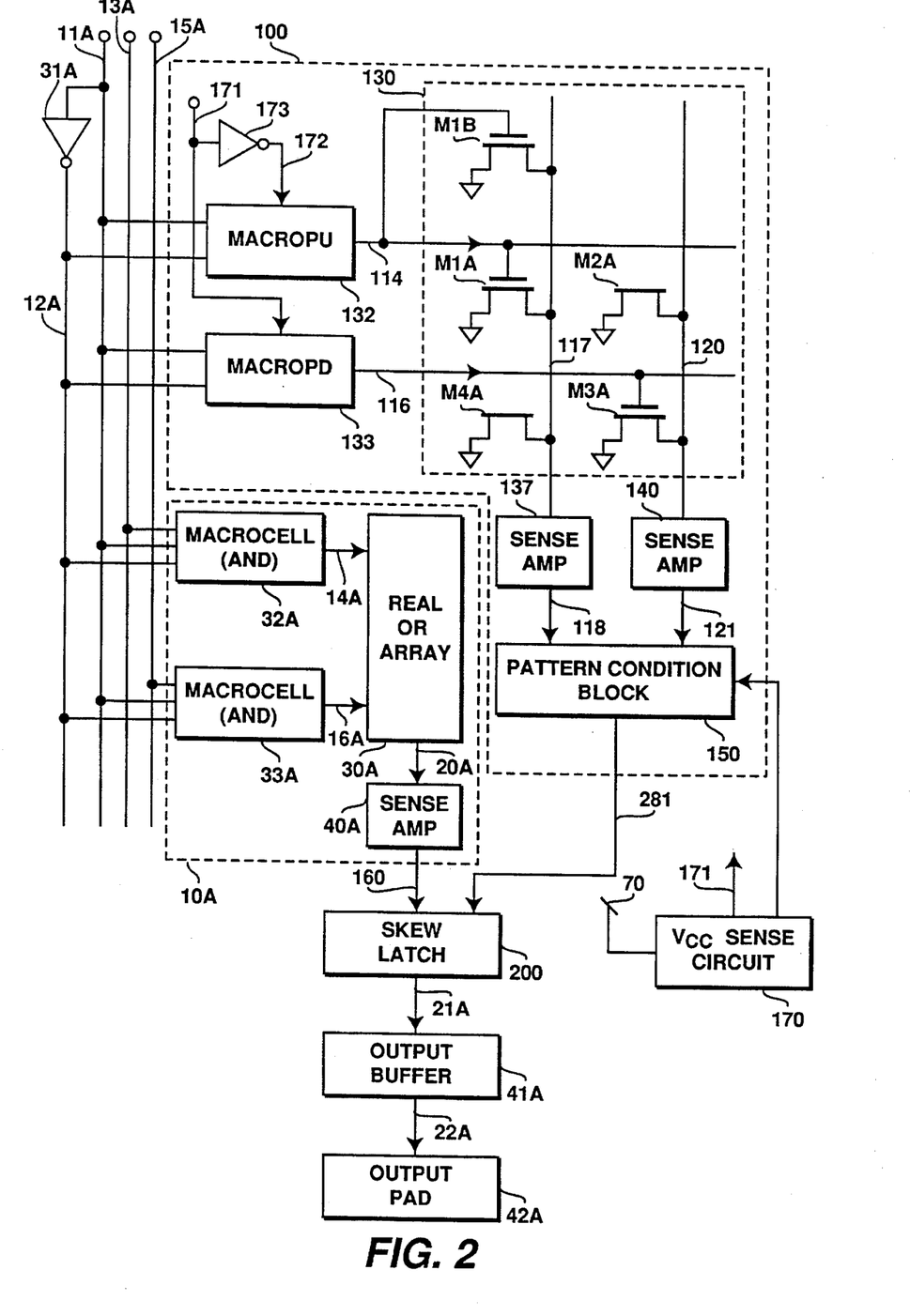
FIG. 2 is a block diagram of the architecture of the PLD chips of the present invention.

Referring now to FIG. 2, the PLD architecture of the present invention is depicted. It includes the real data path 10A, which is similar to the data path of prior art PLDs as was illustrated in FIG. 1, up to and including the sense amplifier. FIG. 2 also illustrates the emulation data path 100, which runs substantially in parallel to real data path 10A. Emulation data path 100 and real data path 10A share common input signal line 11A and its complement, line 12A. As will be detailed later, output line 281 of emulation data path 100 controls the operation of output line 160 of the real data path 10A to the output buffer 41A by the operation of skew latch 200. The output 171 of the $V_{CC}$ sense circuit 170 is used to initialize circuits in the emulation data path 100 into a preferred state upon application of a valid $V_{CC}$ voltage to the $V_{CC}$ power rails of the PLD.

In FIG. 2 the real data path 10A is comprised of macrocells 32A and 33A, each including a memory array performing the equivalent of the logical AND function. The outputs of macrocells 32A and 33A are on lines 14A and 16A, respectively, which feed into the real OR-array 30A, whose output 20A is sensed by sense amplifier 40A. The output of sense amplifier 40A goes out of the real data path 10A on line 160, which feeds the data-in input of skew latch 200.

The emulation data path 100 includes "macropu" block 132, which emulates the propagation delay behavior of the AND macrocell 32A when that macrocell produces a negative output pulse on its output 14A in response to a positive input pulse on line 11A. The emulation data path 100 also includes "macropd" block 133, which emulates the propagation delay behavior of macrocell 32A when that macrocell produces a positive output pulse on its output 14A in response to a positive input pulse on input line 11A.

Figure 3:
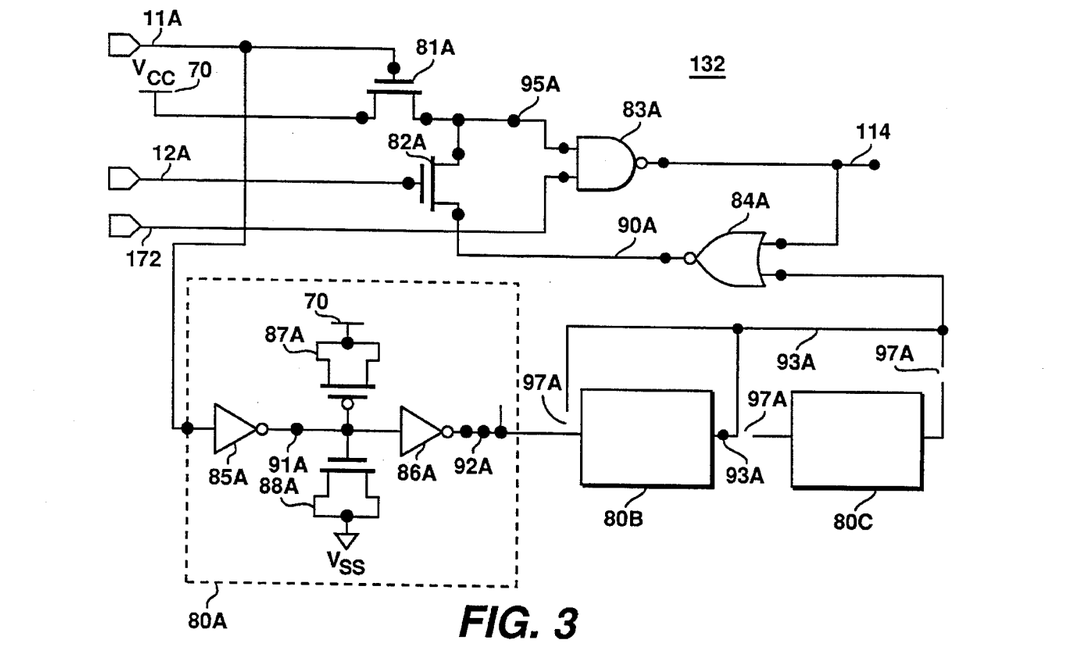
FIG. 3 is a partially block and partially schematic circuit diagram of an emulation macrocell which emulates the behavior of a real macrocell producing a negative-going output pulse in response to an input signal pulse.

FIG. 3 illustrates macropu block 132 in detail. It consists of an set-reset flip-flop (SRFF) composed of NAND gate 83A, NOR gate 84A and NMOS transistors 81A and 82A. The output 114 of the SRFF is also the output of macropu 132. The inputs to the SRFF include a data-in line 70 that is connected to $V_{CC}$, two clock inputs that are connected to the PLD input line 11A and its complement line 12A. Another input on line 93A is a delayed signal from the PLD input on line 11A. The delay between line 11A and line 93A is induced by a chain of inverters and capacitors that comprise delay modules 80A, 80B and 80C. The delay module 80A illustrated in detail as shown in the dotted box, comprised of inverter 85A which receives the input signal 11A and drives inverter 86A and MOS capacitors 87A and 88A. Other implementations of delay module 80A, such as counters and resistor-capacitor pairs (RC) also are possible. Capacitor 87A is a PMOS transistor whose drain and source are shorted together and are connected to the $V_{CC}$ power rail 70. Capacitor 88A is an NMOS transistor whose drain and source are shorted together and are connected to the $V_{SS}$ power rail. The output node 92A of inverter 86A drives another delay module 80B, whose output 93A drives one input of NOR-gate 84A. In actual implementation of the macropu block 132 on a PLD chip, metal connection option 97A is provided to additional delay modules, such as the unconnected module 80C, so that accurate timing delay will be produced by the delay path between nodes 11A and 93A in order to emulate the worst-case delay behavior of the macrocell 32A of FIG. 2.

Figure 4:
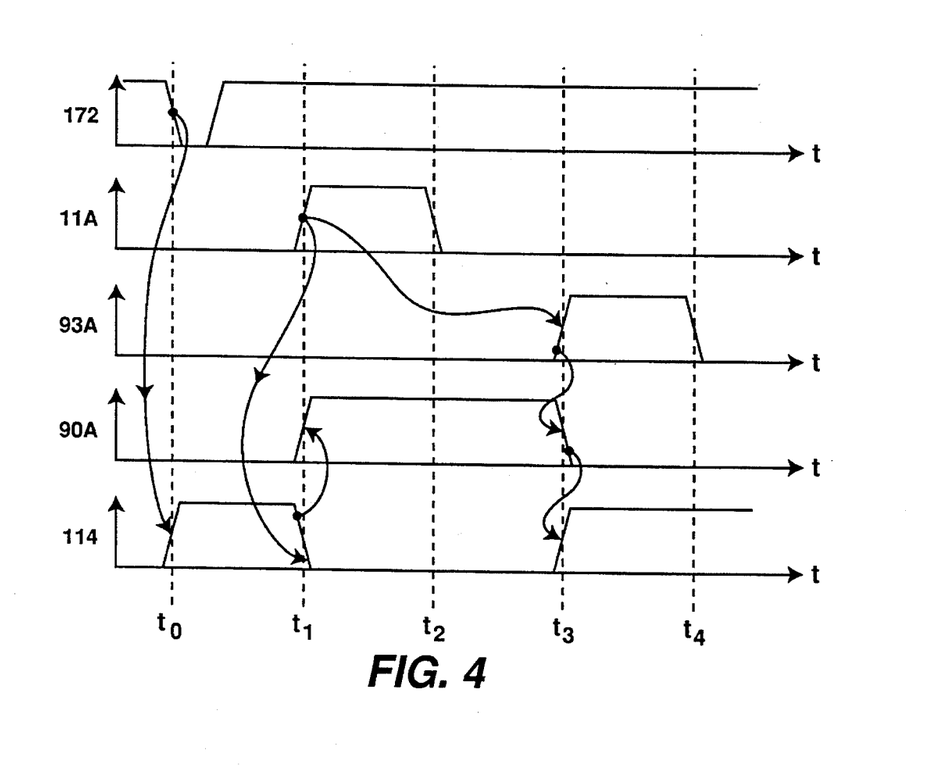
FIG. 4 is a timing diagram for the operation of the emulation macrocell of FIG. 3.

The electrical operation of the macropu block 132 will now be described with reference to the circuit of FIG. 3 and the timing diagram of FIG. 4. A complement of the $V_{CC}$ sense circuit output pulse on line 171 (which, as shown in FIG. 2, is outputted from sense circuit 170 and inputted to inverter 173) is presented on line 172 to AND gate 83A (FIG. 3) of macropu 132 when the PLD is powered for operation. The pulse on line 172 at time $t_0$ initializes the output line 114 to a "1" logic level. When the input pulse to the PLD arrives on line 11A some time later at $t_1$, it enables the "1" logic level on node 70, as shown in FIG. 3, to pass through NMOS transistor 81A onto the input 95A of NAND gate 83A and cause the output 114 of that gate to go down to "0" logic level, thereby starting the negative pulse that emulates the output of macrocell 32A (FIG. 2). The transition of output 114 to a "0" causes storage node 90A (FIG. 3) to go to "1", since line 93A is already at "0". The delay time between the input 11A and line 93A is designed to be longer than the pulse width of the input signal 11A to the PLD. This design ensures that line 93A will receive the beginning of the pulse at line 11A only after it is over. For example, in FIG. 4 the input pulse on line 11A starts at $t_1$ and ends at $t_2$, but line 93A changes phase only at $t_3$, which is some time after $t_2$. The design assumes that the period $t_1$–$t_3$ accurately emulates the worst-case delay through macrocell 32A (FIG. 2). As shown in FIGS. 3 and 4, when line 93A goes to "1" at $t_3$ it brings the storage node 90A back to "0", which in turn passes through NMOS transistor 82A to line 95A and causes NAND gate 83A to drive output line 114 back to a "1" logic level, thus ending the emulation period of the negative pulse from macrocell 32A.

Figure 5:
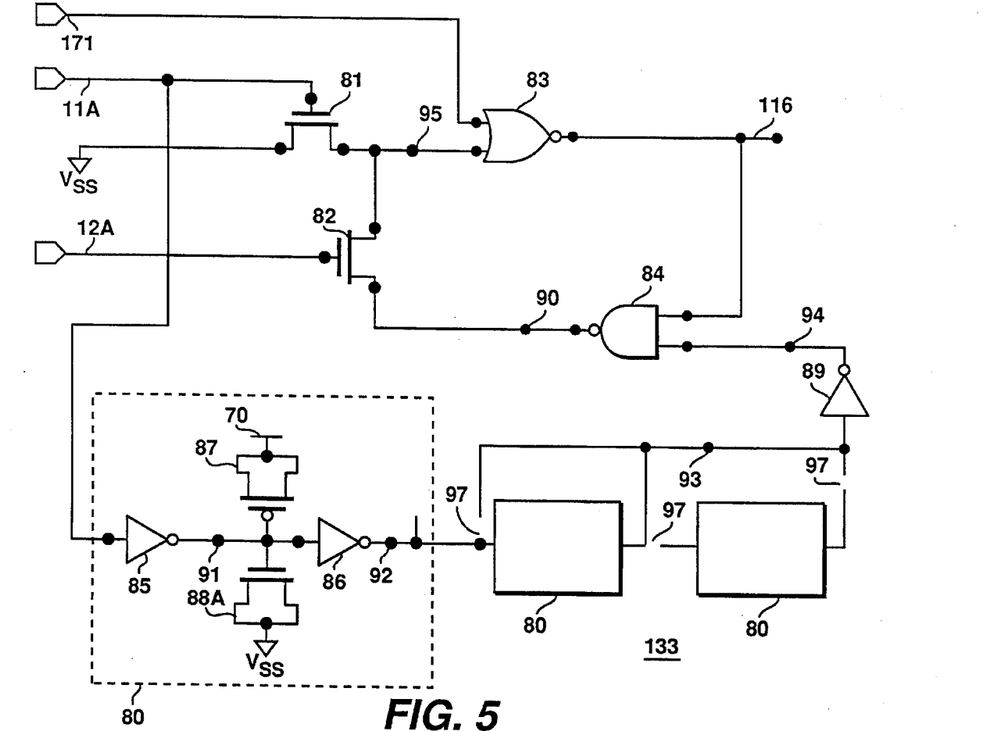
FIG. 5 is a partially block and partially schematic circuit diagram of a emulation macrocell which emulates the behavior of a real macrocell producing a positive-going pulse in response to an input signal pulse.

FIG. 5 illustrates the macropd block 133 in detail. Basically it consists of an set-reset flip-flop (SRFF) composed of NOR gate 83, NAND gate 84 and NMOS transistors 81 and 82. The output 116 of the SRFF is also the output of macropd 133. The inputs to the SRFF include a data-in line that is connected to $V_{SS}$, two clock inputs that are connected to the PLD input signal lines 11A and its complement 12A. Another input 94 is a delayed signal from PLD input 11A. The delay between line 11A and line 94 is induced by a chain of inverters and capacitors that comprise the delay modules 80, which are the same as discussed above in connection with FIG. 3. The first delay module 80 is comprised of inverter 85 that receives the input signal 11A and drives inverter 86 and capacitors 87 and 88. Capacitor 87 is an PMOS transistor whose drain and source are shorted together and connected to the $V_{CC}$ power rail 70. Capacitor 88 is an NMOS transistor whose drain and source are shorted together and connected to the $V_{SS}$ power rail. The output 92 of inverter 86 drives a second delay module 80 whose output 93 drives inverter 89 whose output 94 drives one input of NAND gate 84. In actual implementation of the macropd circuit 133 on a PLD chip, one or more metal connection options 97 are provided to connect additional delay modules 80 so that an accurate timing delay will be produced by the delay path between lines 11A and 93 in order to emulate the worst-case delay behavior of the macrocell 32A of FIG. 2.

Figure 6:
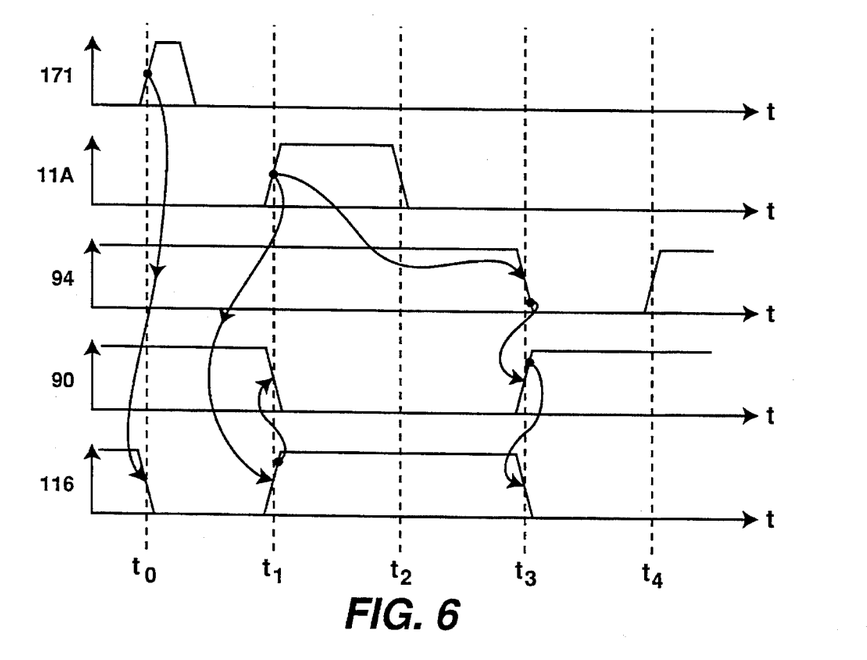
FIG. 6 is a timing diagram for the operation of the emulation macrocell of FIG. 5.

The electrical operation of the macropd block 133 will now be described in reference to FIG. 5 and the timing diagram of FIG. 6. The $V_{CC}$ sense pulse on line 171 is produced by the $V_{CC}$ sense circuit block 170 (FIG. 2) in one of many ways which are known in the art. The pulse is presented on line 171 to macropd 133 (FIG. 2) through NOR gate 83 when the PLD is powered. The pulse on line 171 at time $t_0$ initializes the output 116 of NOR gate 83 to a "0" logic level. When the input pulse to the PLD arrives on line 11A some time later at $t_1$, it enables the "0" logic level of the $V_{SS}$ on the source terminal of NMOS transistor 81 to pass through NMOS transistor 81 to input 95 of NOR gate 83 to cause output 116 to go to a "1" logic level, thereby starting the positive pulse that emulates the output of the macrocell 32A (FIG. 2). The transition of output line 116 to "1" causes storage node 90 to go to "0", since node 94 is already at "1". The delay time between the input 11A and node 94 is designed to be longer than the pulse width of the input signal 11A to the PLD. This design ensures that node 94 will receive the beginning of the pulse at 11A only after it is over. For example, in FIG. 6, the input pulse 11A starts at $t_1$ and ends at $t_2$, but node 94 changes phase only at $t_3$, which is some time after $t_2$. The design assumes that the period $t_1$–$t_3$ accurately emulates the worst-case delay through macrocell 32A when it produces a positive pulse. When node 94 goes to "0" at $t_3$ it brings the storage node 90 back to "1", which logic level in turn passes through NMOS transistor 82 to node 95 and causes NOR gate 83 to drive output node 116 back to the "0" logic level and end the emulation period of the positive pulse from macrocell 32A.

Referring again to FIG. 2, in the emulation data path 100, the output line 114 of macropu 132 drives word line 114 of OR-memory array 130, and the output 116 of macropd 133 drives the word line 116 of OR-memory array 130. In practice there may be a word line driver stage between macropu 132 and OR-array 130 and also between macropd 133 and OR-array 130, but these have not been illustrated in FIG. 2 since they do not add to the understanding of the present invention.

The dependence of the sensing time of a memory array on the stored bit pattern was explained above. Referring to FIG. 2, the OR-memory array 130 stores a pattern which was identified to produce the worst-case propagation delay time from the real OR-array 30A of block 10A. However OR-array 130 does not include all the memory cells of OR-array 30A in order to avoid the expense associated with significant enlargement of the die area, which exponentially increases die production cost.

For example, an implementation of the present invention is found in a new PLD chip named CY7C361, sold after 1990 by Cypress Semiconductor Corporation, assignee of this invention. It was found that the worst-case propagation delay through the OR-array 30A was occurring in two cases. The first worst case took place when only one current conducting EPROM memory cell along a bit line had its word line accessed by having a "1" logic state applied to it, or had applied the $V_{CC}$ voltage of about 5 volts. In this single selected current-conducting first worst case, the single memory cell had to pull the bit line load down by itself and thus produced a long propagation time. The second worst case took place after the simultaneous selection of all the current-conducting EPROM memory cells along a given bit line, also termed a "product term" by PLD designers. Upon transition from a state of all selected cells to a state of no selected cell, the bit line pull up transistor (which is commonly used to bias a bit line in memory arrays) was slow to bring the bit line voltage back to the predetermined, required voltage level determined by the original design.

In order to duplicate these two worst case OR-array pattern characteristics, the new CY7C361 PLD uses only two bit lines 117 and 120 in memory array 130 used to emulate the OR logical function of memory array 30A. In FIG. 2, the bit line 120 alone was chosen to represent the first worst case, and so only one transistor $M_{3A}$ was selected when the PLD was manufactured to conduct current for emulation. Bit line 120 is sensed by sense amplifier 140 whose output is fed into a sense pattern condition block 150.

The second worst case was emulated by bit line 117 alone, so that a plurality of EPROM memory cells will conduct current simultaneously when selected for emulation in operation of the PLD. Each word line in OR-array 130 may drive a plurality of cells on bit line 117, as does word line 114, by driving conducting EPROM cells $M_{1A}$ and $M_{1B}$. The new CY7C361 PLD implements the second worst case by driving four cells on bit line 117, but any number up to the maximum number of cells on a bit line of the real OR-array 30A may be used. Sense amplifier 137 senses the second worst case output and outputs the result onto line 118 to pattern condition block 150.

Figure 7:
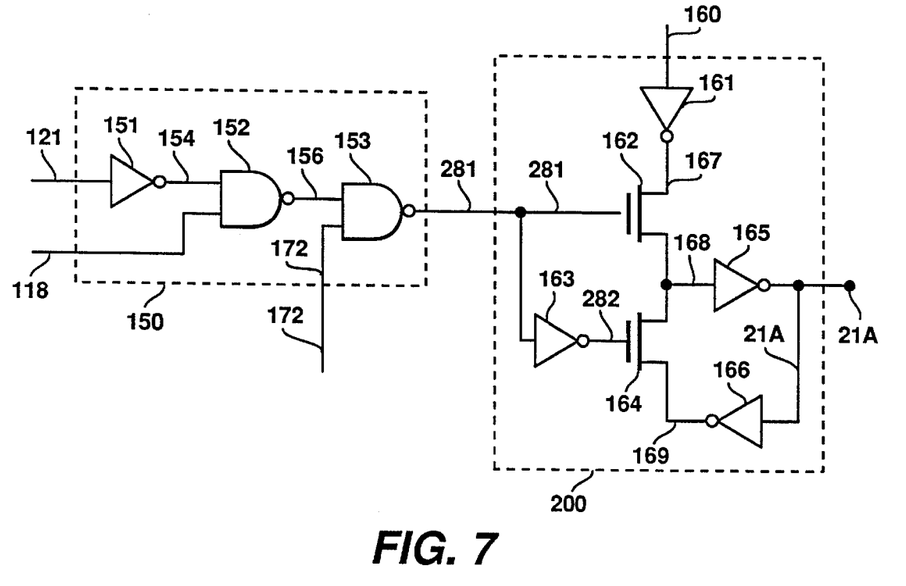
FIG. 7 is a schematic circuit diagram of the worst case pattern sensitivity condition of the OR-memory array of the latch of the present invention.

FIG. 7 illustrates the details of the sense pattern condition block 150, which operates as a logical function generator, as well as the skew latch circuit 200. The sensed two worst case patterns are ANDed to produce the one worst case propagation delay time of the two and to output it to the skew latch 200 through line 281.

Referring to FIG. 7 (and FIG. 2, where indicated), in sense pattern condition block 150, inverter 151 inverts the phase of the input line 121 in order to synchronize the phases of the signals sensed from the two bit lines. This is done because bit line 120 (FIG. 2) of the first worst case is sensed while its voltage is decreasing, thus producing a first logic state at output 121 of the sense amp 140 (FIG. 2). When the bit line 117 (FIG. 2) of the second worst case is sensed as its voltage is increasing, a second logic state is produced at output 118 of sense amp 137 (FIG. 2). The logic function NAND is performed by NAND gate 152, such that only when both inputs are "high" is the output on line 156 "low". This "low" signal is inverted by NAND gate 153 to drive input line 281 of the skew latch 200. The other input of NAND gate 153 comes from the $V_{CC}$ sense circuit 170 (FIG. 2) on line 172. Sense circuit 170 performs the function of a power rail voltage validity indicator, which initializes the skew latch upon application of a valid voltage to the $V_{CC}$ power rail, e.g., approximately 5 volts. The skew latch initialization takes place as a result of a short negative pulse on line 172, which in turn produces a positive pulse from NAND gate 153 onto line 281 and forces the data from the real data path 10A (FIG. 2) through input 160 of inverter 161 to be stored at the output node 21A.

The skew latch 200 is a data-flip-flop (DFF). Its input terminals are data input 167, clock input 281, and its output terminal is data output node 21A. Data from the real data path 10A (FIG. 2) arrives on line 160 and is destined to pass to output node 21A. However since the arrival time of the data on line 160 is sensitive to patterns stored in the memory, the data will have to wait for a ready signal from the emulation data path on line 281. Once a sense pattern condition ready signal on line 281 sets a "1" logic level on that line, MOS transistor 162 in skew latch 200 turns on and transfers the real data from line 160 to output node 21A. Inverter 161 is a phase adjuster and node 169 is the storage node of the DFF. The data in the DFF will be latched when another transition takes place at the input of the PLD, which in turn causes the sense amplifiers of the emulation data path 100 (FIG. 2) to produce a not ready "0" signal at the input 281 of skew latch 200.

The output 21A of skew latch 200 drives the input of the output buffer 41A (FIG. 2) which in turn drives output pad 42A (FIG. 2).

The measurement of the CY7C361 PLD which uses the new architecture of this invention showed that the delay added by this invention to the overall propagation time of 13 nanoseconds was only 0.3 nanosecond. On the other hand skew at the output due to pattern sensitivity was substantially eliminated.

Figure 8:
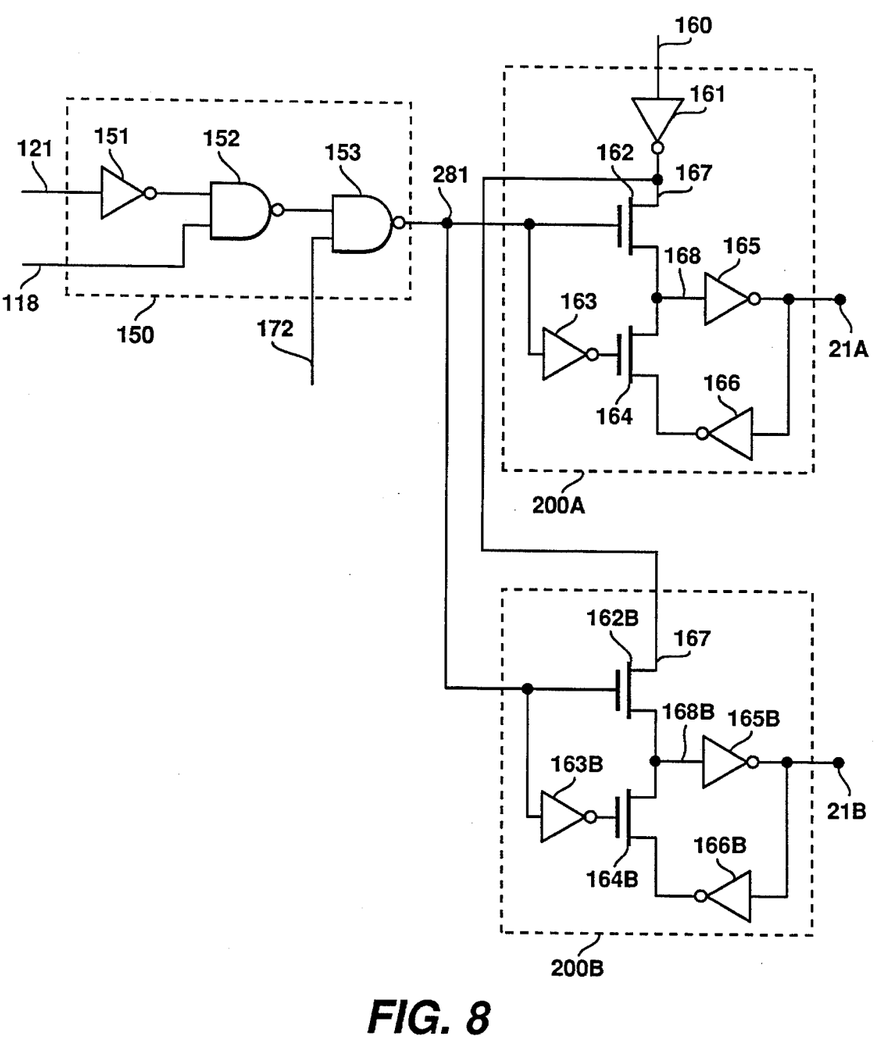
FIG. 8 is a schematic circuit diagram of a second embodiment of the worst case pattern sensitivity condition of the OR-memory array of the latch of the present invention.

FIG. 8 illustrates another embodiment of the invention where the sense pattern condition block 150 drives two skew latches 200A and 200B simultaneously. The real data from path 10A (FIG. 2) on line 160 drives one skew latch 200A, but its complement (inverted by inverter 161) on line 167 drives the second skew latch 200B so as to produce complementary output signals on lines 21A and 21B. The advantage of this scheme is that a complementary output buffer 41A (FIG. 2) can be used to speed the signal path to output pad 42A (FIG. 2), thus regaining that 0.3 nanosecond that were added to the propagation delay of the new CY7C361 PLD. In addition, the skew between the true output and the complement output signals will be substantially eliminated.

The preferred embodiments of the invention have now been described. Various substitutions and alternatives will be apparent to persons skilled in the art from the teachings of this invention. It is therefor not intended that the invention be limited to the described embodiments, but only as defined by the appended claims.

What is claimed is:

1. A programmable logic device architecture for the elimination of timing skews in output data from the programmable logic device due to memory logic array pattern sensitivity, comprising:

input terminals, one of which receives a clock pulse and one of which receives an input signal;

an output circuit from said programmable logic device including a skew latch having output terminals;

a real signal path enabled by the clock pulse having an output and a worst case delay coupled between said input terminals and said skew latch, said skew latch causing real data to be transferred to the output terminals only when a clock input of the skew latch is in one of two possible conditions but not when the clock input to the skew latch is in the other condition, thus preventing the input signal from arriving at the output terminals prior to a predetermined acceptable time as well as preventing the data at the output terminals from changing when the clock input to the skew latch is in the other of the two possible conditions;

an emulation signal path coupled between the signal input terminal and said skew latch, said emulation signal path generating at the output of the emulation signal path, only once during the clock pulse, a signal having a delay at least substantially equal to said worst case delay in said real signal path;

whereby an output signal from said skew latch can emerge only when enabled by a signal from said emulation signal path after a time equal to or greater than said worst case delay through said real signal path, thereby completely preventing timing skews in the output data from causing premature change of the data at the output terminals of the programmable logic device.

2. The programmable logic device of claim 1 where said skew latch comprises:

a first flip-flop having a first input coupled to the output of said emulation signal path, a second input providing data coupled to a first output of said real signal path and a first output representing the data provided from said second input; and a second flip-flop having a first input coupled to the output of said emulation signal path, a second input providing data coupled to a second complementary output of said real signal path and an output representing the data provided from said second input.

3. The programmable logic device of claim 1 wherein said real signal path includes a first memory array performing a first logical function and a second memory array performing a second logical function.

4. The programmable logic device of claim 3 wherein said first logical function is an AND function and said second logical function is an OR function.

5. The programmable logic device of claim 3 wherein said emulation signal data path is comprised of two parts, a first part emulating said first memory array and a second part emulating said second memory array.

6. The programmable logic device of claim 5 wherein said first part comprises set-reset flip-flops and said second part comprises a third memory array which provides an output.

7. The programmable logic device of claim 6 where said first part of said emulation signal path includes a first input for data;

a second input coupled to said first input through a time delay generator means;

a third input coupled to a power rail voltage validity indicator coupled to a power rail, said validity indicator performing a voltage check on the power rail for validity, and if the voltage on the power rail is valid, providing an appropriate output signal to be used to initialize the skew latch;

a fourth data input; and an output coupled to said third memory array.

8. The programmable logic device of claim 6 wherein said third memory array includes a plurality of memory cells;

a first bit line coupled to one of said memory cells which conducts during emulation; and a second bit line coupled to a plurality of said memory cells which all conduct during emulation.

9. The programmable logic device of claim 6 wherein a first of said set-reset flip-flops produces a positive-going pulse with a duration approximating the propagation delay time of said first memory array; and a second of said set-reset flip-flops producing a negative-going pulse with a duration approximating the propagation delay time of said first memory array.

10. The programmable logic device of claim 6 wherein the output of said third memory array is coupled to a logical function generator having first and second inputs which, in turn, is coupled to provide to the output of said emulation signal path a signal which results from performing a predetermined logic function.

11. The programmable logic device of claim 10 wherein said third memory array includes:

a plurality of memory cells;

a first bit line coupled to one of said memory cells which conducts during emulation; and a second bit line coupled to a plurality of said memory cells which all conduct during emulation.

12. The programmable logic device of claim 11 where said first bit line is coupled to said first input of said logical function generator and said second bit line is coupled to said second input of said logical function generator.

13. The programmable logic device of claim 12 further including a power rail validity indicator where the set-reset flip-flops and the logical function generator are initialized to predetermined logical levels by an output signal from said power rail validity indicator.

* * * * *